United States Patent [19]

Hayashi et al.

[11] Patent Number: 5,045,788
[45] Date of Patent: Sep. 3, 1991

[54] DIGITAL SQUID CONTROL SYSTEM FOR MEASURING A WEAK MAGNETIC FLUX

[75] Inventors: Hajime Hayashi, Yamato; Yutaka Igarashi, Yokohama; Takehiko Hayashi; Takao Goto, both of Kawasaki; Shinichi Amemiya, Yokohama, all of Japan

[73] Assignee: Fujitsu Limited, Kawasaki, Japan

[21] Appl. No.: 499,963

[22] Filed: Mar. 27, 1990

[30] Foreign Application Priority Data

Mar. 30, 1989 [JP] Japan ................................. 1-79299

[51] Int. Cl.$^5$ .......................................... G01R 33/035
[52] U.S. Cl. .................................... 324/248; 307/306; 505/846
[58] Field of Search ............... 324/248; 505/845, 846; 307/306

[56] References Cited

U.S. PATENT DOCUMENTS 4,672,359  6/1987  Silver .................................... 324/248

Primary Examiner—Walter E. Snow
Attorney, Agent, or Firm—Staas & Halsey

[57] ABSTRACT

A digital SQUID control system for measuring a weak magnetic flux irradiated from an object includes: a SQUID having Josephson junctions and a superconductively coil; a pick-up coil detecting the weak magnetic flux from the object and flowing a measuring current in the pick-up coil, and an input coil magnetically coupled to the superconductivity coil through the measuring current; a feedback coil magnetically coupled to the superconductivity coil through a feedback current; a feedback circuit for counting positive and negative pulses input from the SQUID, for converting count values to an analog voltage, and for converting the analog voltage to the feedback current; an alternating has current generating circuit connected to the SQUID through an injection terminal, for supplying the alternating bias current to the SQUID; and a pulse rate measuring circuit for calculating a sum of the positive and negative pulses, for converting the sum to an analog voltage, and for outputting the analog voltage to the alternating current generating circuit. Further, the alternating current generating circuit controls an amplitude of the alternating bias current in such a way that the sum of the positive and negative pulses per unit of time becomes constant, and the feedback circuit controls the feedback current under the controls of the alternating bias current amplitude in such a way that a difference between the positive pulses and the negative pulses becomes zero by flowing the feedback current through the magnetically coupled superconductivity coil.

4 Claims, 7 Drawing Sheets

DIGITAL SQUID CONTROL SYSTEM FOR MEASURING A WEAK MAGNETIC FLUX

BACKGROUND OF THE INVENTION

1. Field of the Invention

The present invention relates to a super conducting quantum interference device (SQUID), more particularly, it relates to a digital SQUID control system used for a magnetic flux meter for measuring a weak magnetic flux irradiated from an object to be measured.

2. Description of the Related Art

SQUID's are utilized for detecting a weak magnetic flux with very high sensitivity. That is, the SQUID can respond to a change in a weak magnetic flux based on the quantum interference effect of the magnetic flux. Accordingly, the SQUID is mainly utilized for, particularly, a high sensitivity magnetic flux meter having a highly sensitive magnetic sensor. The high sensitivity magnetic flux meter is utilized, for example, in the field of medical equipment to measure the magnetic flux from a human body.

In general, the SQUID can be classified into two types, i.e., an analog type SQUID and a digital type SQUID. Both analog and digital types have two Josephson junctions and a superconductivity coil. The present invention relates to a digital type SQUID.

The high sensitivity magnetic flux meter utilizing the SQUID includes a SQUID, a pick-up coil detecting the magnetic flux from an object and magnetically coupled to the SQUID, and a feedback circuit supplying a control current to a feedback coil also magnetically coupled to the SQUID.

SUMMARY OF THE INVENTION

The object of the present invention is to provide a digital SQUID control system able to measure a weak magnetic flux irradiated from an object, for example, a human body, with a very high sensitivity and very high precision.

In a digital SQUID control system for measuring a weak magnetic flux irradiated from an object, in accordance with the present invention, the system includes: a SQUID having Josephson junctions and a superconductivity coil; a pick-up coil and an input coil, the pick-up coil detecting the weak magnetic flux from the object and flowing a measuring current in the pick-up coil, and the input coil magnetically coupled to the superconductivity coil through the measuring current; a feedback coil magnetically coupled to the superconductivity coil through a feedback current; a feedback circuit for counting positive and negative pulses input from the SQUID, for converting count values to an analog voltage, and for converting the analog voltage to the feedback current; an alternating biascurrent generating circuit connected to the SQUID through an injection terminal, for supplying the alternating bias current to the SQUID; and a pulse rate measuring circuit for calculating a sum of the number of positive and negative pulses, for converting the sum to an analog voltage, and for outputting the analog voltage to the alternating bias current generating circuit. Further, the alternating bias current generating circuit controls an amplitude of the alternating bias current in such a way that the sum of the number of positive and negative pulses per unit of time becomes constant, and the feedback circuit controls the feedback current in such a way that a difference between the positive pulse and the negative pulse becomes zero by flowing the feedback current to the magnetically coupled superconductivity coil.

DESCRIPTION OF THE PREFERRED EMBODIMENTS

Before describing the preferred embodiments, an explanation will be given of a conventional digital SQUID control system.

Figure 1:
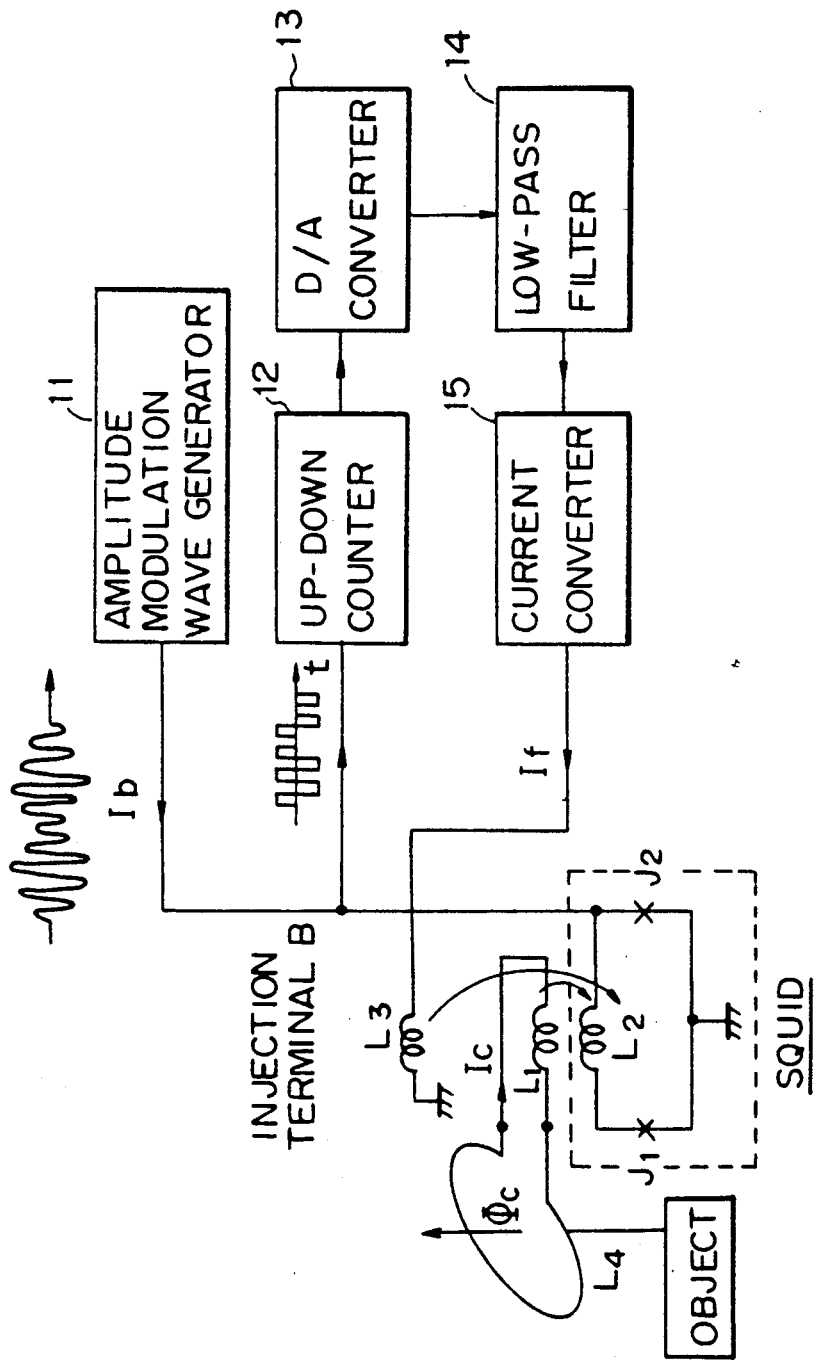
FIG. 1 is a schematic block diagram of one example of a conventional digital SQUID control system.

FIG. 1 is a schematic block diagram of one example of the conventional digital SQUID control system used for a magnetic flux meter. In FIG. 1, reference number 11 denotes an amplitude modulation wave generator, 12 an up-down counter, 13 a digital-to-analog converter, 14 a low-pass filter, and 15 a current converter. Further, a SQUID has Josephson devices including Josephson junctions J1, J2 and a super conductivity coil L2, L1 denotes a superconductivity input coil, L3 denotes a feedback coil, and L4 denotes a superconductivity pick-up coil.

In this structure, the pick-up coil L4 detects magnetic flux $\phi c$ irradiated from an object, for example, a human body, to be measured. Accordingly, the current flows in the input coil L1 in proportion to the magnetic flux. The coil L2 of the SQUID is arranged in the vicinity of the input coil L1 so as to obtain magnetic coupling with each other. The SQUID constitutes a loop having the Josephson junctions J1, J2 and the coil L2. Further, the alternating bias current Ib generated from the amplitude modulation wave generator 11 flows in the loop through an injection terminal B. Accordingly, the bias current Ib is superimposed on the current flowing in the loop.

The SQUID is a type of switching element. That is, when a current exceeding a predetermined threshold value flows in the loop of a SQUID, the voltage is generated therefrom. Accordingly, to switch the SQUID in response to the measuring current, the alternating bias current Ib is supplied to the SQUID in the vicinity of the threshold value of the SQUID.

The switching pulse from the SQUID, which is superimposed by the bias current Ib, is counted by the up-down counter 12 through the injection terminal B. That is, the number of positive pulses and the negative pulses are counted by the up-down counter 12 in such a way that the counter is increased when the positive pulse is input, and the counter is decreased when the negative pulse is input. In this case, the positive pulses and the negative pulses are the pulses generated from the SQUID when the flux on opposite polarity is applied.

Since the output of the up-down counter 12 is a digital value, this digital value is converted to an analog voltage by the D/A converter 13. The low-pass filter 14 is provided for eliminating a high frequency noise component contained in the analog voltage. The current converter 15 is provided for converting the analog voltage to a current. Accordingly, the positive and negative pulses at the injection terminal B are feedback to the feedback coil L3 through the low-pass filter 14 and the current converter 15 as the feedback current If. As shown in the drawing, the feedback coil L3 is arranged in the vicinity of the superconductivity coil L2 so as to obtain magnetic coupling to the coil L2.

FIGS. 2A to 2D are graphs for explaining the operation of the digital SQUID magnetometer in FIG. 1.

Figure 2A:
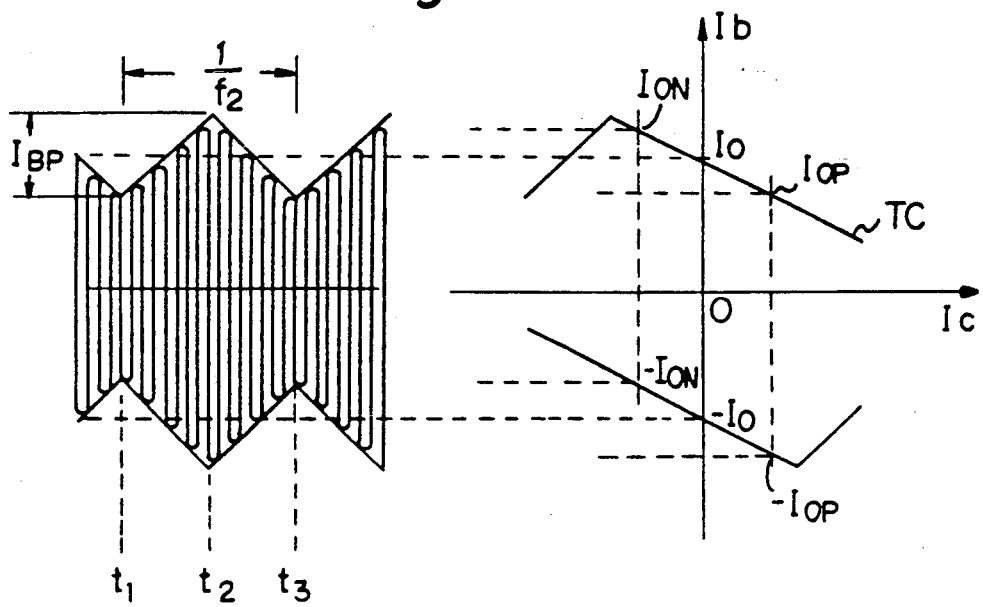
FIGS. 2A to 2D are graphs for explaining the operation of a SQUID shown in FIG. 1.

A threshold characteristic curve TC of the Josephson junctions J1 and J2 is shown in FIG. 2A. In this case, Ic denotes a current to be measured (below, measuring current) flowing through the pick-up coil, +Io and −Io are threshold values, and Ib is an alternating bias current.

Assuming that the measuring current Ic is zero, that is, no magnetic flux from the object exists in the pick-up coil, when the amplitude of the bias current Ib has a value between the threshold value +Io and the threshold value −Io, the output voltage of the SQUID becomes zero level in the vicinity of the times t1 and t3. While, when the measuring current Ic is zero and the amplitude of the bias current Ib is larger than the threshold values +I and −Io, the output voltage of the SQUID becomes a high voltage level in the vicinity of the time t2, and the SQUID outputs the positive and negative pulses.

Figure 2B:
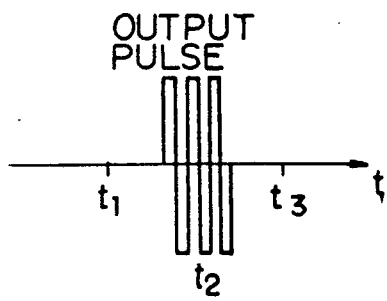

Accordingly, when the measuring current Ic is zero, the number of the positive pulses pulse from the Josephson junctions) is equal to the number of negative pulses as shown in FIG. 2B.

Figure 2C:
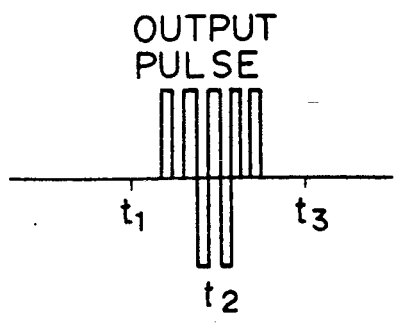

When the measuring current Ic is positive and the bias current Ib has a value between the threshold value +Iop and the threshold value −Iop, since the threshold values are shifted to the threshold value +Iop and the threshold value −Iop in accordance with the threshold characteristic curve TC, the number of positive pulses becomes larger than that of the negative pulses as shown in FIG. 2C.

Figure 2D:
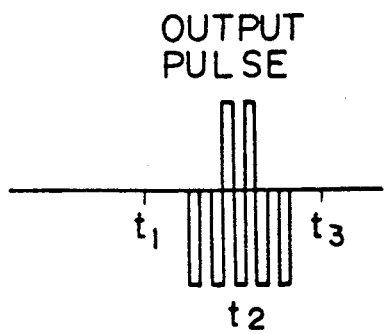

When the measuring current Ic is negative and the bias current Ib has a value between the threshold value +Ion and the threshold value −Ion, the number of the positive pulses becomes smaller than the number of negative pulses as shown in FIG. 2D.

In the actual measurement process, the amplitude of the bias current Ib is set to the vicinity of the threshold value Io. A difference current corresponding to a difference between the number of the positive pulses and the number of the negative pulses is supplied to the feedback coil L3.

The difference current is supplied to the coil L2 by means of magnetic coupling between the coil L3 and the coil L2. That is, the magnetic flux generated by the difference current at the feedback coil L3 is coupled to the coil L2. Accordingly, the feedback current is superimposed on the measuring current. As a result, the feedback current indicates the magnetic flux to be measured because the magnetic flux $\phi c$ from the object corresponds to the feedback current If at the time when the number of positive pulses is equal to the number of negative pulses as shown in FIG. 2B.

In the conventional art, the amplitude of the bias current Ib supplied to the Josephson junctions J1 and J2 is modulated by a triangle wave having a small amplitude and a low frequency as shown in FIG. 2A.

Accordingly, in the conventional art, to increase the precision of measurement, the amplitude of the triangle wave is set to as small a value as possible (i.e., modulation rate is small), or the frequency of the bias current Ib is set to as high a value as possible so as to increase the number of the positive and negative pulses per unit hour at the injection terminal B.

When the amplitude of the triangle wave is set to a small value, however, the positive or negative pulses are not obtained if a weak measuring current Ic is input to the pick-up coil when the amplitude of the bias current Ib accidentally changes to a small amplitude.

On the contrary, when the amplitude of the bias current Ib becomes too large, the number of the positive and negative pulses does not change because the amplitude of the bias current always exceeds the threshold value. Further, when the frequency of the bias current Ib increases, the cost of parts constituting the circuits becomes high.

Accordingly, to solve the above problems, in the present invention, the alternating bias current Ib supplied to the Josephson junctions is controlled by the feedback operation in accordance with the number of positive pulses, the number of negative pulses, and the sum of both unit hour. That is, the amplitude of the alternative bias current Ib is controlled in such a way that these pulses become constant at the injection terminal B:

As a result, it is possible to measure the magnetic flux from an object with high sensitivity, high precision, and low cost as explained in detail below.

Figure 3:
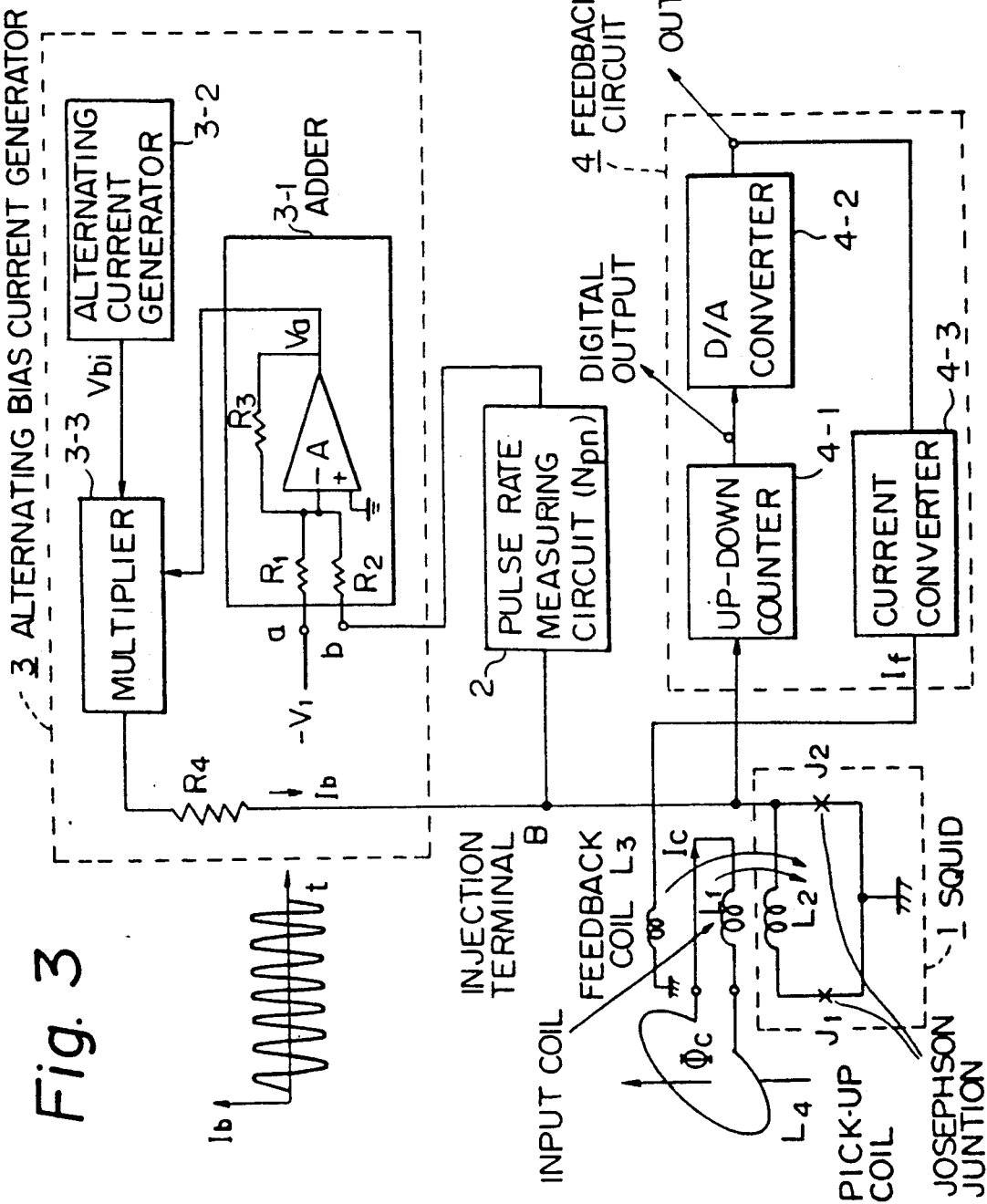
FIG. 3 is a schematic block diagram of the digital SQUID control system according to an embodiment of the present invention.

FIG. 3 is a schematic block diagram of the digital SQUID control system according to an embodiment of the present invention. In FIG. 3, reference number 1 is the same SQUID as shown in FIG. 1. Further, the up-down counter 4-1, the D/A converter 4-2 and the current converter 4-3 are the same components as shown in FIG. 1.

Reference number 2 denotes a pulse rate measuring circuit. 3 denotes an alternating bias current generation circuit. The alternating bias current generation circuit 3 further comprises an adder 301 having an operational amplifier A, an alternating current signal generator 3-2 and a multiplier 3-3.

As shown in FIG. 3, the SQUID is formed by a loop consisting of two Josephson junctions J1, J2 and a superconductivity coil L2. As explained above, the output of the SQUID is switched between "zero level voltage state" (output voltage is zero) and "high level voltage state (output voltage is not zero) in accordance with whether or not the measuring current flowing through the loop exceeds the threshold level.

As previously explained, the superconductivity coil L2 is magnetically coupled to the input coil L1, and the measuring current Ic flowing through the coil L1 is supplied to the Josephson junctions J1 and J2.

The pulse rate measuring circuit 2 counts the sum (Npn) of the number of positive and the negative pulses, each per unit hour, at the injection terminal B. These pulses are output from the Josephson junctions J1 and J2. Vpn denotes the voltage converted from the sum Npn.

The alternating bias current generator 3 generates the alternating bias current Ib and supplies it to the SQUID through the injection terminal B. In this case, the voltage Vpn from the pulse rate measuring circuit 2 is input to the operational amplifier A through the resistor R2. The operation of this generator 3 is explained in detail hereinafter.

The feedback coil L3 is magnetically coupled to the superconductivity coil L2 and the feedback current If is supplied to the coil L2.

The pick-up coil L4 detects the weak magnetic flux irradiated from the object and generates an inductive current (i.e., measuring current Ic) therein. The measuring current Ic flows in the input coil L1 and the input coil L1 generates a magnetic flux. Since the input coil L1 is provided in the vicinity of the coil L2 so as to be magnetically coupled to the coil L2, the measuring current Ic can flow in the loop of the SQUID.

As explained above, when the measuring current superimposed by the bias current Ib is larger than the predetermined threshold value, the Josephson junctions is switched from the zero level state to the high level state. In this case, the amplitude of the bias current is set to the vicinity of the threshold value of the SQUID. This is because the SQUID is switched between zero level and high level in response to the threshold value. Accordingly, when the bias current Ib is superimposed on the measuring current Ic, it is possible to easily obtain the positive pulses and the negative pulses from the SQUID. These positive and negative pulses at the injection terminal B are counted by the pulse rate measuring circuit 2.

The adder 3-1 generates a voltage Va from the operational amplifier A. In the operational amplifier A, the voltage Vpn from the pulse rate measuring circuit 2 and the constant voltage $-V1$ are input to the input terminals "a" and "b", respectively, and the voltage Va is obtained by summing the voltage Va and V1, by inverting the above sum. The voltage Va is input to the multiplier 3—3.

The multiplier 3-3 multiplies the alternating bias voltage Vbi of the generator 3-2 by the voltage Va of the operational amplifier A. As a result, the bias current Ib is obtained from the output of the multiplier 3—3 through the resistor R4. The bias current Ib is supplied to the injection terminal B. In the injection terminal B, the amplitude of the bias current is controlled in such a way that the sum of the positive and negative pulses can be always set to a constant value.

The feedback circuit 4 is formed by the up-down counter 4-1 for obtaining the difference between the number of the positive pulses and the number of the negative pulses, the D/A converter 4-2 for converting the difference to the analog voltage, and the current converter 4-3 for converting the analog voltage to a current and for supplying the current to the feedback coil L3.

The feedback coil L3 is magnetically coupled to the superconductivity coil L2 so that the feedback current is supplied to the coil L2. Accordingly, as explained above, the amount of the feedback current If to the SQUID corresponds to the magnetic flux $\phi c$ to be measured.

FIGS. 4A to 4E are graphs for explaining the operation of the circuit shown in FIG. 3.

Figure 4A:
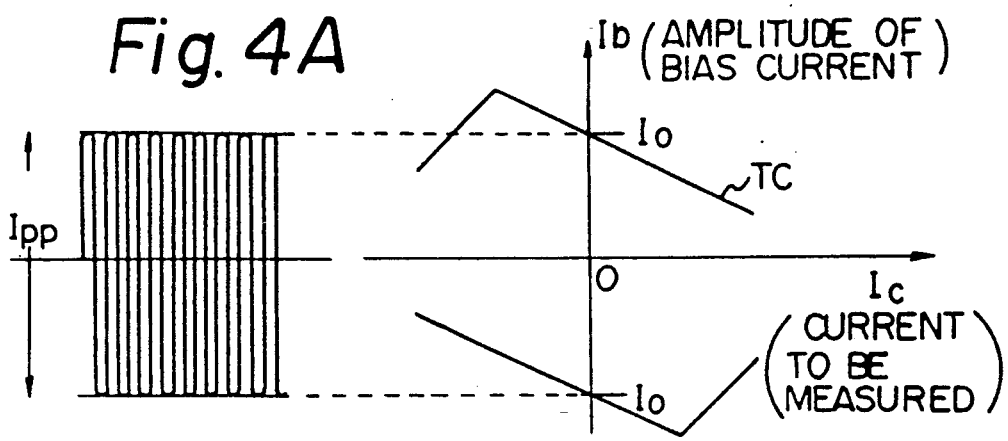
FIGS. 4A to 4E are graphs for explaining the operation of the circuit shown in FIG. 3.

In FIG. 4A, as shown in FIG. 2A, the curve TC is the characteristic curve of the SQUID. The ordinate denotes the alternating bias current Ib and the abscissa denotes the measuring current Ic.

Figure 4B:
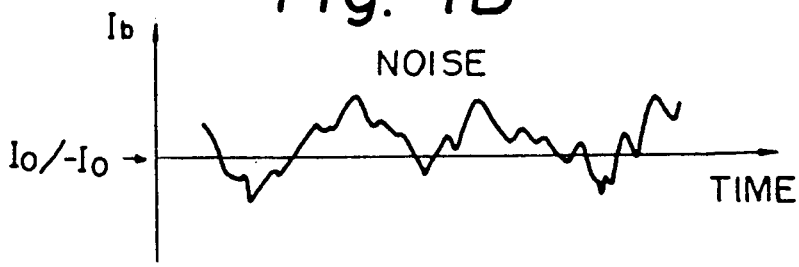

When the measuring current Ic is zero and the amplitude of the bias current Ib is gradually increased to the vicinity of the threshold value, in actual practice, the noise component generated from the SQUID is superimposed on the amplitude of the bias current Ib as shown in FIG. 4B.

Figure 4C:
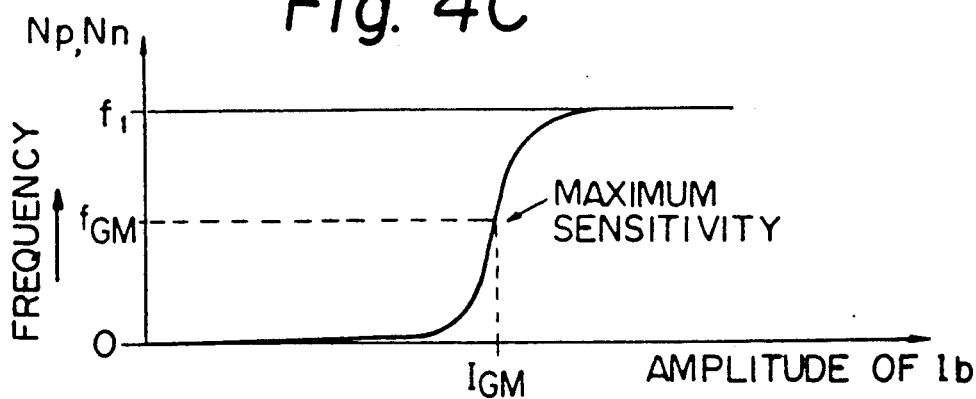

The number of the positive pulses Np and the number of the negative pulses Nn are also gradually increased as shown by the curve in FIG. 4C. That is, when the amplitude of the bias current Ib is smaller than the threshold value Io, most of the positive and negative pulses are not output from the SQUID. However, when the amplitude of the bias current Ib is larger than the threshold value Io, the positive and negative pulses are entirely output from the SQUID and do not change in accordance with the measuring current. As shown in FIG. 4C, when the amplitude of the bias current Ib is further increased, the positive and negative pulses Np and Nn are saturated and become equal to the frequency f1 of the bias current Ib as shown by the curve in FIG. 4C.

In this case, as shown by the curve in FIG. 4C, when the amplitude of the bias current Ib is the value $I_{GM}$ at which the gradient is maximum the rate of change of the number of the positive pulses Np and the of the negative pulses Nn becomes maximum. Accordingly, in this point, since the change of the positive and negative pulses become maximum, the detection sensitivity of the measuring current can be set to the highest state.

Figure 4D:
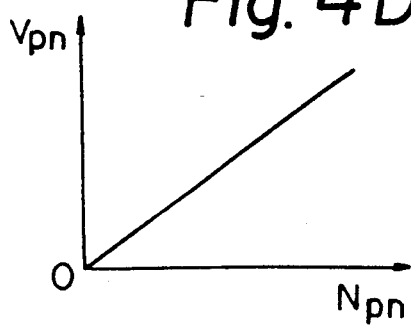

In FIG. 4D, the ordinate denotes the voltage Vpn and the abscissa denotes the sum Npn of the number of the positive and negative pulses. The pulse rate measuring circuit 2 converts the sum Npn to the voltage Vpn and outputs the voltage Vpn.

Figure 4E:
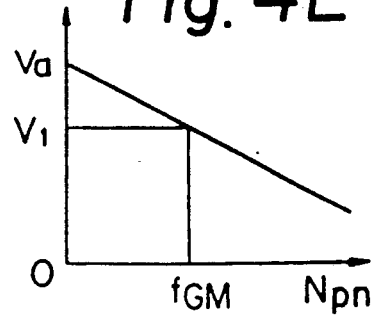

In FIG. 4E, the ordinate denotes the voltage Va and the abscissa denotes the sum Npn of the positive and negative pulses. The adder 3-1 outputs the voltage Va based on the input voltage Vpn and V1. In this case, the relationship between the sum Npn and the voltage Vpn is shown in FIG. 4D. The voltage V1 input to the operational amplifier A corresponds to the frequency fgm of the bias current Ib.

Figure 5:
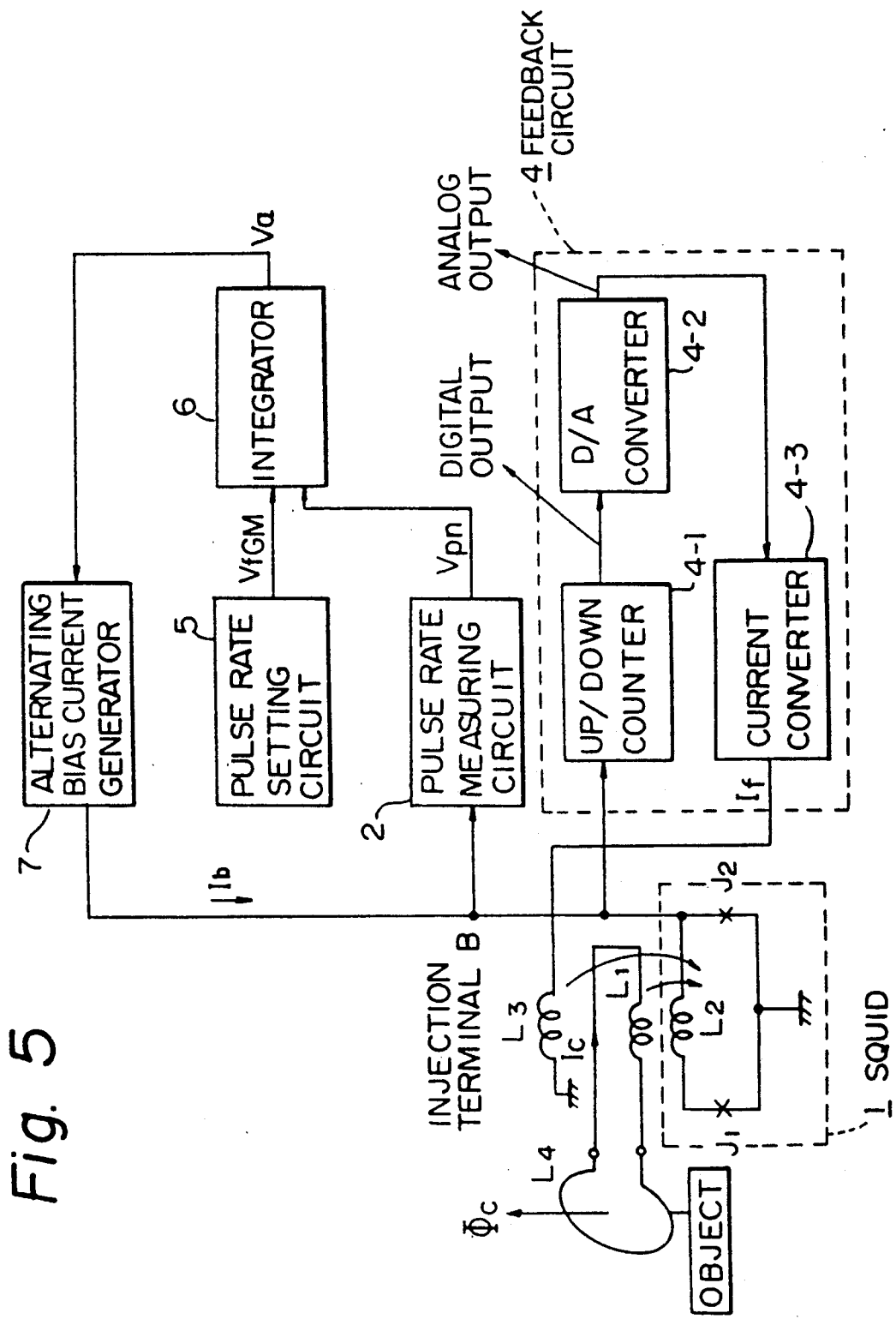
FIG. 5 is a schematic block diagram of the digital SQUID control system according to another embodiment of the present invention.

FIG. 5 is a schematic block diagram of the digital SQUID control system according to another embodiment of the present invention. In FIG. 5, reference number 5 denotes a pulse rate setting circuit, 6 denotes an integrator, and 7 denotes the alternating bias current generator. The other components are the same components as shown in FIG. 3.

As explained above, the voltage Vpn is obtained by summing the number of the positive and negative pulses and by converting the sum to a voltage in the pulse rate measuring circuit 2. The pulse rate setting circuit 5 generates the voltage Vfgm corresponding to the frequency fgm of the bias current Ib. The voltages Vfgm and Vpn are input to the integrator 6. The integrator 6 outputs the voltage Va, which is obtained by the difference between the voltage Vfgm and the voltage Vpn, to the alternating bias current generator 7. The amplitude of the bias current Ib is controlled in such a way that the sum Npn of the positive and negative pulses becomes equal to the frequency fgm of the bias current.

Figure 6:
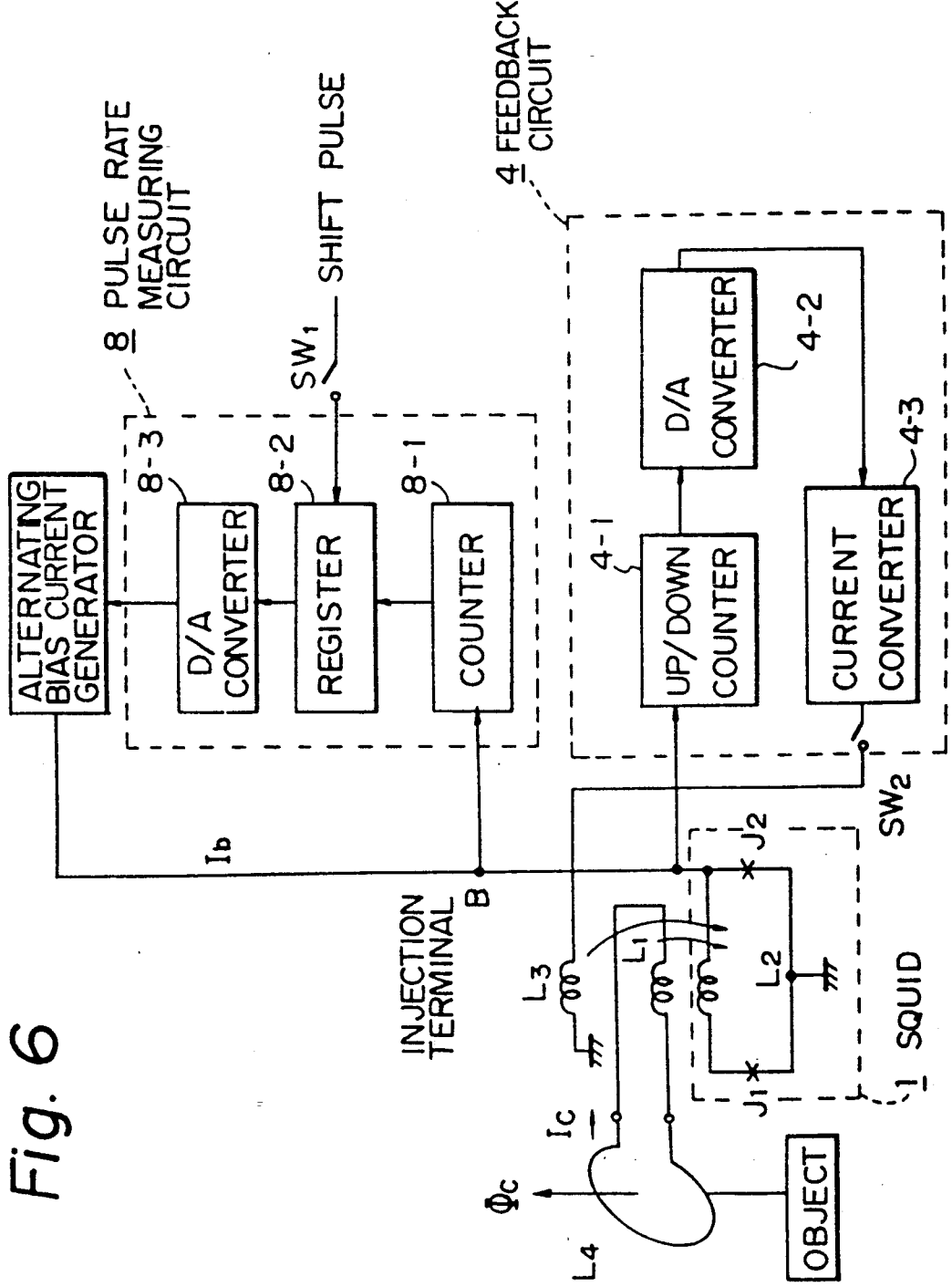
FIG. 6 is a schematic block diagram of the digital SQUID control system according to still another embodiment of the present invention.
Figure 7:
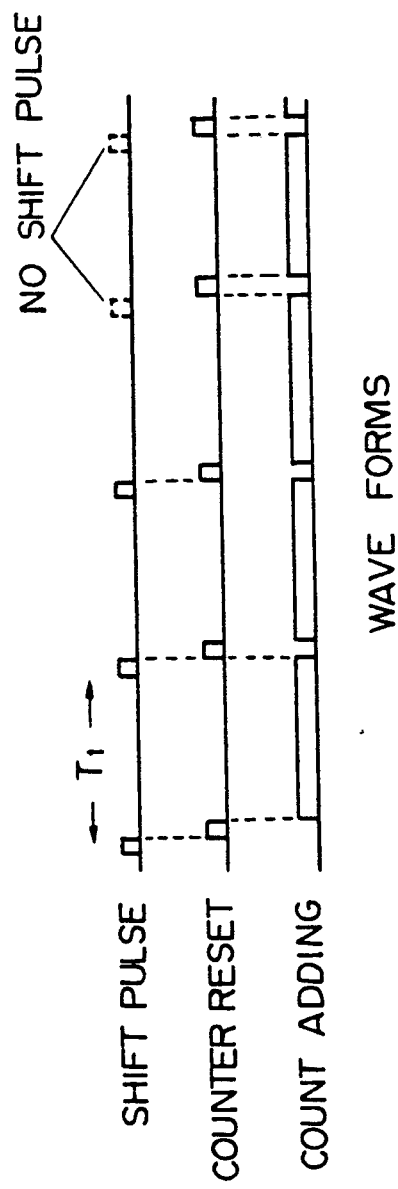
FIG. 7 is a waveform diagram for explaining a shift pulse and counter reset.

FIG. 6 is a schematic block diagram of the digital SQUID control system according to still another embodiment of the present invention. FIG. 7 is a wave-forming diagram for explaining the shift pulse and counter reset.

In FIG. 6, reference numeral 8 denotes a pulse rate measuring circuit having a counter 8-1, a register 8-2, and a D/A converter 8-3. The counter 8-1 counts the number of the positive and negative pulses or the sum thereof when the measuring current Ic is at a zero level voltage state. The register 8-2 sets the number of the pulses counted by the counter 8-1 based on the shift pulse input through the switch SW1. The output of the register 8-2 is converted to an analog voltage by the D/A converter 8-3, and the analog voltage is then input to the alternating biascurrent generator 7 which outputs the bias current Ib.

In this case, the switch SW1 is switched to the open state when the number of pulses at the injection terminal B reaches the predetermined value. The amplitude of the bias current is then controlled based on the number of the pulses held in the register 8-2.

We claim:

1. A digital SQUID control system for measuring a weak magnetic flux irradiated from an object, comprising:
   a SQUID having Josephson junctions and a superconductivity coil connected in series with said Josephson junctions so as to form a loop circuit, said SQUID outputting positive and negative pulses;
   detecting means having a pick-up coil, said pick-up and input coils forming a loop circuit, said pick-up coil detecting the weak magnetic flux from the object and flowing a measuring current in said pick-up coil, and said input coil being magnetically coupled to said superconductivity coil through the measuring current;
   a feedback coil magnetically coupled to said superconductivity coil through a feedback current;
   a feedback circuit, operatively connected to said SQUID at an input side thereof and operatively connected to said feedback coil at an output side thereof, for counting the positive and negative pulses output from said SQUID, for converting count values to an analog voltage, and for converting the analog voltage to the feedback current;
   an alternating bias current generating circuit, operatively connected to said SQUID through an injection terminal, for generating an alternating bias current and supplying said alternating bias current to said SQUID through said injection terminal; and
   a pulse rate measuring circuit, operatively connected to said SQUID through said injection terminal at an input side thereof and operatively connected to said alternating bias current generating circuit at an output side thereof, for calculating a sum of a number of the positive and negative pulses which are output from said SQUID when the alternating bias current is supplied to said SQUID through said injection terminal and outputting a voltage;
   wherein said alternating bias current generating circuit controls an amplitude of said alternating bias current in such a way that said sum of the number of the positive and negative pulses per a unit of time becomes a constant value, and at which time the frequency of the output pulses from said SQUID have the largest gradient for said alternating bias current;
   said feedback circuit controlling the feedback current under control of the amplitude of said alternating bias current in such a way that a difference between the positive pulses and the negative pulses becomes zero by flowing the feedback current through said magnetically coupled superconductivity coil.

2. A digital SQUID control system as claimed in claim 1, wherein said alternating current generating circuit comprises:
   an adder, operatively connected to said pulse rate measuring circuit, and including an operational amplifier for inputting a voltage from said pulse rate measuring circuit and a constant voltage applied by a variable voltage source determined based on a frequency of said alternating bias current, for inverting a sum of the voltage and constant voltage and for outputting a resultant voltage;
   generating means for generating an alternating bias voltage; and
   a multiplier, operatively connected to said generating means, for multiplying an alternating bias voltage from said generating means by the voltage from said operational amplifier, and for outputting said alternating bias current to said injection terminal.

3. A digital SQUID control system as claimed in claim 1, said digital SQUID control system further comprises:
   a pulse rate setting circuit for generating a setting voltage corresponding to the frequency of said alternating bias current; and
   an integrator, operatively connected to said pulse rate setting circuit and said pulse rate measuring circuit, for receiving the setting voltage and the voltage output from said pulse rate measuring circuit for counting the sum of the positive pulses and negative pulses, and for outputting a difference voltage between the setting voltage and the voltage to said alternating bias current generating circuit to control the amplitude of said alternating bias current.

4. A digital SQUID control system as claimed in claim 1, wherein said pulse rate measuring circuit comprises:
   a counter, operatively connected to said injection terminal, for counting the number of positive pulses, the number of negative pulses, and the sum of the positive and the negative pulses;
   a register, operatively connected to said counter, for setting a value counted by said counter by using a shift pulse input through a switch; and
   a digital-to-analog converter, operatively connected to said register, for converting pulses stored in said register to an analog value, and outputting the analog value to said alternating bias current generating circuit to control the amplitude of said alternating bias current.

* * * * *

UNITED STATES PATENT AND TRADEMARK OFFICE
CERTIFICATE OF CORRECTION

PATENT NO. : 5,045,788

DATED : SEPTEMBER 3, 1991

INVENTOR(S) : HAJIME HAYASHI ET AL.

It is certified that error appears in the above-identified patent and that said Letters Patent is hereby corrected as shown below:

TITLE PAGE, [56] References Cited, after line 1 insert

--4,947,118   8/1990   Fujimaki.

OTHER PUBLICATIONS

IEEE Transactions on Electron Devices Vol. 35, No. 12, December 1988, "A Single-Chip SQUID Magnetometer", Norio Fujimaki et al., pps. 2412-2418.--.

Col. 1, line 61, "for," should be --for--.
Col. 2, line 55, "a" should be --the--.
Col. 2, line 55, "the" (second occurrence) should be --a--;
     line 63, "the "(second occurrence) should be deleted.

Col. 3, line 33, "+I" should be --+Io--;
     line 38, "pulses pulse" should be --pulses (output pulses--;
     line 47, "that of the" should be --the number of--.

UNITED STATES PATENT AND TRADEMARK OFFICE
CERTIFICATE OF CORRECTION

PATENT NO. : 5,045,788

DATED : SEPTEMBER 3, 1991

INVENTOR(S) : HAJIME HAYASHI ET AL.

It is certified that error appears in the above-identified patent and that said Letters Patent is hereby corrected as shown below:

Col. 4, line 31, "both unit" should be --both pulses, per unit--;
      line 32, "alternative" should be --alternating--;
      line 48, "301" should be --3-1--.

Signed and Sealed this

Sixteenth Day of February, 1993

Attest:

STEPHEN G. KUNIN

Attesting Officer     Acting Commissioner of Patents and Trademarks